United States Patent [19]

Daly et al.

[11] 4,365,019
[45] Dec. 21, 1982

[54] POSITIVE-WORKING RESIST QUINONE DIAZIDE CONTAINING COMPOSITION AND IMAGING METHOD HAVING IMPROVED DEVELOPMENT RATES

[75] Inventors: Robert C Daly, Greece .; John R. Guild, Rochester, both of N.Y.

[73] Assignee: Eastman Kodak Company, Rochester, N.Y.

[21] Appl. No.: 290,461

[22] Filed: Aug. 6, 1981

[51] Int. Cl.$^3$ .......................... G03C 1/60; G03C 1/72; G03F 7/08

[52] U.S. Cl. .................................. 430/190; 430/191; 430/192; 430/165; 430/296; 430/326; 430/330

[58] Field of Search ............... 430/190, 191, 192, 165, 430/326, 296

[56] References Cited

U.S. PATENT DOCUMENTS

| | | |
|---|---|---|
| 2,806,035 | 9/1957 | Margot . |
| 2,857,391 | 10/1958 | Engelhardt et al. |
| 2,861,078 | 11/1958 | Miller et al. . |
| 2,933,502 | 4/1960 | Klopping . |
| 3,184,471 | 5/1965 | Harder . |
| 3,184,472 | 5/1965 | Carboni . |
| 3,274,208 | 9/1966 | Jones et al. |
| 3,418,333 | 12/1968 | Warren . |
| 3,478,046 | 11/1969 | Sarett et al. |
| 3,522,044 | 7/1970 | Hackmann . |
| 3,567,453 | 3/1971 | Borden .................. 430/191 |
| 3,661,582 | 5/1972 | Broyde .................. 430/191 |
| 3,779,778 | 12/1973 | Smith et al. |
| 3,833,602 | 9/1974 | Heinz et al. |
| 3,859,099 | 1/1975 | Petropoulos et al. ............ 430/191 |
| 3,961,961 | 6/1976 | Rich . |
| 3,984,253 | 10/1976 | Nelson . |
| 4,101,323 | 7/1979 | Buhr et al. |
| 4,164,421 | 8/1979 | Shinozaki et al. .................. 430/165 |
| 4,216,332 | 8/1980 | Lenthe et al. |
| 4,247,611 | 1/1981 | Sander et al. . |
| 4,266,000 | 5/1981 | Stahlhofen et al. ................. 430/192 |

FOREIGN PATENT DOCUMENTS

| | | |
|---|---|---|
| 1132529 | 6/1967 | United Kingdom . |
| 1357367 | 6/1974 | United Kingdom . |
| 291182 | 2/1971 | U.S.S.R. ............................. 430/192 |
| 332413 | 4/1972 | U.S.S.R. ............................. 430/191 |

OTHER PUBLICATIONS

Massa & Rachford, *ACS Polymer Preprint*, vol. 17, No. 2, p. 184, (1976).

*Primary Examiner*—Charles L. Bowers, Jr.
*Attorney, Agent, or Firm*—Dana M. Schmidt

[57] ABSTRACT

There are disclosed a resist composition and imaging method wherein the development rate of the composition is improved by using a polyhalogenated heterocyclic sensitivity-enhancing agent.

7 Claims, No Drawings

POSITIVE-WORKING RESIST QUINONE DIAZIDE CONTAINING COMPOSITION AND IMAGING METHOD HAVING IMPROVED DEVELOPMENT RATES

FIELD OF THE INVENTION

This invention relates to positive-working resists and methods of preparing and using them.

BACKGROUND OF THE INVENTION

Resist compositions are facing new challenges in the field of microelectronic fabrications. The need to mass-produce microscopically dimensioned, etched configurations has resulted in demand for resists with the properties of greater speed, higher temperature resistance, and even more importantly, more rapid processing so as to reduce the unit cost of the end-product electronic device. ("Speed" as used herein refers to the sensitivity of the composition to activating radiation, and is not to be confused with development rates.) Chief among those properties that, prior to this invention, have retarded rapid processing, has been the long development time needed to remove the exposed resist. Slow development rates particularly retard the overall process if a plurality of resist exposures and developments are needed for a given electronic device.

Substituents, for example, organic acids, that might be expected to improve solubility in the developer, and therefore improve the development rate, may adversely affect other properties, such as the high temperature resistance, speed, or development latitude. Furthermore, substituents that are known to enhance temperature resistance have little predictability concerning their effect on development rates. It has been difficult, therefore, prior to the present invention to identify a sensitivity-enhancing agent that provides improved development rates as well as maintaining outstanding speed and temperature resistance.

U.S. Pat. No. 3,661,582 describes sensitivity-enhancing agents for positive-working E-beam resists and photoresists such as 1,2-quinone diazide esters, that enhance the speed of the resist composition. The sensitivity-enhancing agents comprise heterocyclic compounds, the nuclear atoms of which consist of carbon atoms and from 2 to 4 nitrogen atoms at least one of which is bonded to hydrogen. Of the large number of compounds described, 5-chloro-benzotriazole and 1H-benzotriazole are included. However, there is no recognition or suggestion in the aforementioned patent that any of the compounds described therein, with or without particular substituents, would provide enhanced development rates as well as maintain speed.

SUMMARY OF THE INVENTION

Development rates of a quinone diazide resist composition are unexpectedly improved when the heterocyclic sensitivity-enhancing agent for this resist, as described in U.S. Pat. No. 3,661,582, is modified so as to contain at least two halogen substituents appended from the nuclear carbon atoms of the heterocyclic agent.

Thus, in accordance with one aspect of the invention, there are advantageously featured a resist composition and supports bearing the same, which have enhanced development rates without sacrificing either speed or high temperature resistance. Specifically, a positive-working 1,2-quinone diazide condensation product resist composition is provided wherein the sensitivity-enhancing agent for the resist comprises a heterocyclic compound having one, two or three rings, the nuclear atoms of which consist of carbon atoms and from 2 to 4 nitrogen atoms. At least one of the nitrogen ring atoms is bonded to hydrogen. The agent further includes at least two halogen substituents appended from the nuclear carbon atoms.

The use of the above-noted resist composition provides an improved imaging method.

DESCRIPTION OF THE PREFERRED EMBODIMENTS

It has been discovered that the heterocyclic sensitivity-enhancing agents of the aforementioned U.S. Pat. No. 3,661,582 unexpectedly produce improved development rates in positive-working resists incorporating quinone diazide esters, if they are polyhalogenated as described in the Summary.

The art-recognized class of sensitivity-enhancing agents useful with 1,2-quinone diazide condensation products comprises heterocyclic compounds having one, two or three rings, the nuclear atoms of which consist of carbon atoms and from 2 to 4 nitrogen atoms wherein at least one of the nitrogen atoms is bonded to hydrogen. The bonding of at least one of the nitrogen atoms to hydrogen appears to be important to the instant invention, as analogous compounds lacking such hydrogen bonding, such as polyhalogenated quinoxaline, do not provide the advantages of the invention.

It has been discovered that the polyhalogenation of the members of this class of agents serves to unexpectedly provide improved rates of development compared to the same agent lacking the polyhalogenation. As used herein, "polyhalogenation" refers to the substitution of halogens so that at least two halogens are appended from nuclear carbon atoms. Preferably, each halogen is appended from a different nuclear carbon atom. "Rates of development" refer to the length of time needed to completely remove the areas that were imagewise exposed.

Specific sensitivity-enhancing agents useful in the invention when polyhalogenated include benzotriazole; 1,2-naphthotriazole; indazole; 6,7-dihydro-5H-pyrrolotetrazole; and 1,3,4-imidazopyridine.

The type of halogen used to polyhalogenate the heterocycle is not believed to be critical. Thus, polychloro-, polybromo-, polychlorobromo- and polyiodo-substituted heterocycles are believed to be useful.

Optionally the sensitivity-enhancing agent includes a mixture of polyhalogens—that is, if the polyhalogenated agent is benzotriazole, for example, the sensitivity-enhancing agent is either a pure dichlorobenzotriazole, a pure tetrachlorobenzotriazole, or it is

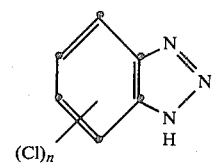

wherein n is 2, 3 and 4 in admixture. That which is selected depends in part on the preferred mode of synthesis. For example, the pure di- or the pure tetrachlorinated compound is prepared by conventional techniques, such as by the reactions described in A.

Krentzberger et al, *Arch. Pharm.,* Vol. 312, pp. 806–811 and Wiley et al, *J. Am. Chem. Soc.,* Vol. 77, p. 5105 (1955). On the other hand, the mixed polyhalogen is prepared by controlling the concentrations in an admixture of the non-halogenated heterocyclic compound with aqua regia. As the relative concentration of the heterocycle of this admixture decreases, the number of halogen substituents on the heterocyclic compound increases.

To form a mixed halogen, the starting material for the aqua regia reaction is, for example, a brominated compound.

The following preparations are illustrative of the synthesis that are available to append the polyhalogens to the nuclear carbon atoms of the sensitivity-enhancing agent.

Preparation No. 1

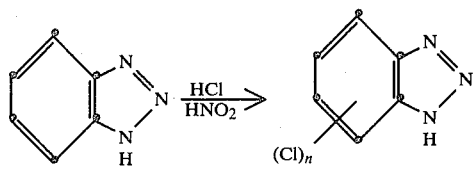

1,H-Benzotriazole (119 g, 1 mole) was added to an aqua regia solution containing 1.75 L of concentrated nitric acid and 5.15 L of concentrated hydrochloric acid. The resulting red solution was brought to reflux with mechanical stirring. After 30 minutes, a strong evolution of nitrous oxide commenced. After about 90 minutes of heating, a precipitation began to form. At 3 hours after the reaction started, the entire reaction mixture was a slurry.

The reaction mixture was allowed to cool to room temperature overnight. The precipitate was collected on a filter and washed with water. The wet precipitate was placed in a beaker and slurried with 2 L of water. The collected material was air dried for 2 hours on the filter funnel and dried at 65° C. in a vacuum oven with a nitrogen bleed for 24 hours. A white, crystalline solid (172 g, m.p. 220°–226° C.) was obtained with a chlorine content of 49% by elemental analysis. This gives an average substituent composition for the product mixture of 3.2 chlorine and 0.8 hydrogen.

Preparation No. 1'

The mixture of Preparation No. 1 was further refined based upon the extent of the polyhalogenation, by recrystallizing in ethanol to obtain three fractions—most insoluble (fraction I), most soluble (fraction S), and a fraction inbetween (fraction M). The results were as follows:

| Fraction | Average n for (Cl)$_n$ | m.p. (°C.) |
| --- | --- | --- |
| I | 3.95 | 260–265 |
| M | 3.35 | 230–236 |
| S | 2.78 | 215–219 |

Preparation No. 2

When the procedure of Preparation No. 1 was repeated except that the concentration of benzotriazole was doubled, the average n value of the mixture decreased to 3.05.

Any one of the resulting products of Preparation Nos. 1, 1', and 2 is useful in the invention.

Any positive-working resist containing a light-sensitive quinone diazide condensation product is useful with the sensitivity-enhancing agents of the invention. For example, phenol- or cresol-formaldehyde resins condensed with the esterifying moiety A

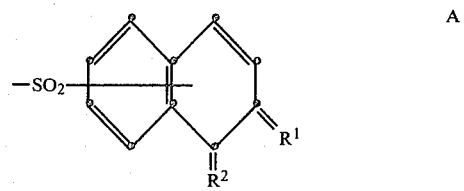

wherein one of $R^1$ and $R^2$ is $N_2$ and the other is O, are highly useful, as are aminostyrene copolymers condensed with the moiety A. Examples of these quinone diazide condensation products are well known in the literature, for example, U.S. Pat. No. 4,141,733, and British Specification No. 1,546,633, the contents of which are expressly incorporated herein by reference.

In addition to the above esters, which are primarily polymers, other compounds, such as monomers or binders are optionally included in the resist composition. Useful examples of such monomers include quinone diazide sulfonic acid esters such as the esters listed in Kosar, *Light-Sensitive Systems,* 1965, pp. 343–352, and particularly those prepared from dihydroxy- and trihydroxybenzene, for example, 1,2-naphthoquinone diazide sulfonic acid esterified 1,3,5-trihydroxybenzene, as described in U.S. Pat. No. 3,130,047; and quinone diazide sulfonic acid esters of trihydroxybenzophenone. Useful examples of binders include vinyl-addition polymers such as acrylates or methacrylates copolymerized with acrylic or methacrylic acid and other vinyl-addition polymers examples of which are set forth in the aforesaid U.S. Pat. No. 4,141,733.

The amounts of the components of the resist composition vary, depending upon the use and exposure source intended. Preferably, the monomer, if any, comprises from about 0.5 to about 25 weight % of the dry solids of the resist composition, and the quinone diazide condensation product from about 1.0 to about 15 weight %. The sensitivity-enhancing agent is present in an amount effective to increase for a predetermined exposure level the development rate of the composition compared to the same composition wherein the agent has less than two halogen substituents. For this purpose, preferably the agent comprises from about 5 to about 30 weight % of the dry solids weight of the resist, and most preferably about 15 weight %. Because these amounts of sensitivity-enhancing agents are not as soluble in the preferred solvents if the halogenation produces only a pure di-, tri-, or tetrahalogenated compound, the most preferred form of the sensitivity-enhancing agent is a mixture of the pure halogenated heterocyclic compounds, e.g., where n is a mixture of 2, 3 and 4.

The resist composition of the invention is preferably applied to a suitable support and contact or projection-exposed imagewise to activating radiation such as light or E-beam radiation. The "images" that are useful include conventional micro images, such as those useful in forming integrated circuits. Useful supports include sheets and foils of such metals as aluminum, copper, magnesium, zinc, etd.; glass and glass coated with such metals as chromium, chromium alloys, steel, silver, gold, platinum, etc.; synthetic polymeric materials such as poly(alkyl methacrylates), e.g., poly(methyl methacrylate), polyester film base, e.g., poly(ethylene terephthalate), poly(vinyl acetals), polyamides, e.g., nylon, cellulose ester film base, e.g., cellulose nitrate, cellulose acetate, cellulose acetate propionate and cellulose acetate butyrate. For the manufacture of integrated circuit devices, silicon or silicon dioxide wafers, as well as silicon nitride and chromium-coated glass plate supports, are particularly useful. Depending upon the support selected, adhesion aids are optionally applied first as a sub-coating.

Any conventional method can be used to apply the composition to the support. The preferred method is as a coating using an appropriate solvent. Useful coating techniques include whirler-coating, spray coating, curtain coating, and roll coating. Useful solvents include alcohols, esters, ethers, and ketones and particularly ethanol, 2-ethoxyethyl acetate, n-butyl acetate, 4-butyrolactone, and mixtures thereof.

Preferred final thicknesses of the coatings vary, depending upon the final use and the etchants that are to be used, if any. Examples of preferred thicknesses range from between about $0.5\mu$ to about $20\mu$.

The pre-bake and post-bake techniques described in U.S. Pat. No. 4,141,733 are preferred for the invention.

The equipment used to expose the resist is conventional. The exposure times vary depending on the desired results and equipment used, preferred times being in the range of about 5 sec. to about 90 sec.

Following exposure, the latent image so formed is developed by treating the exposed composition with an appropriate developer. Useful developers include conventional, caustic positive-working developers. For example, those containing sodium hydroxide or phosphate, and those described in U.S. Pat. No. 4,141,733 and European Pat. No. 23,758, e.g., quaternary alkanol ammonium hydroxides containing a sulfite stabilizer are particularly useful. It is the time needed for such development, i.e., the rate of development, which is markedly improved by this invention.

Following development, conventional wet or dry etching processes are useful to etch away the support in the areas left unprotected by the development step.

As noted, other benefits of the present invention include the maintenance of a photographic speed of the composition that is substantially as high as that described in U.S. Pat. No. 3,661,582. Presumably this occurs because, except for the polyhalogenation, the sensitivity-enhancing agent is otherwise the same as the heterocyclic compounds therein described. Furthermore, high temperature resistance is also maintained.

Examples

The following examples are included for a further understanding of the invention.

Example 1

A stock composition was prepared as follows:

| | |
|---|---|
| cresol-formaldehyde novolak-type resin obtained under the trade name "Alnoval 429K" from American Hoechst (binder) | 22.6 g |
| quinone diazide sulfonic acid ester of trihydroxybenzophenone (monomer) | 4.1 g |

-continued

| | |
|---|---|
| 2-ethoxyethyl acetate | 62.0 g |
| n-butyl acetate | 6.2 g |
| mixed xylenes | 5.1 g |

10 g was taken from the stock composition and added to 2.5 millimoles of one of the sensitivity-enhancing agents of Table I. The mixture was applied in each case to a chromium-coated glass support at a thickness of $1.0\mu$, and dried by convection heating at 90° C. for 30 minutes. The resist was imagewise exposed for 6 sec. to a 200-watt medium pressure mercury arc lamp at a distance of about 15 cm using an apparatus having the trade name Oriel 200-watt Solar Simulator, from Oriel Corp. The latent image was developed using an aqueous alkaline developer maintained at a constant temperature and comprising tetramethylammonium hydroxide available under the trade name "LSI-Type" from Hunt Chemical Co. Table I indicates the time (development rate) needed to obtain complete clean-out of the exposed areas.

TABLE I

| Example | Sensitivity-Enhancing Agent | Development Rate (Sec.) | $\Delta T^*$ (A) |
|---|---|---|---|
| Control A | none | 38 | 400 |
| Control B | benzotriazole | 18 | 100 |
| Control C | 5-chloro-1H—benzotriazole (compound 8 of U.S. Pat. No. 3,661,582) | 16.5 | 100 |
| 1 | polychlorobenzotriazole, mixture, average n = 3.0 (Preparation No. 1) | 7.5 | 100 |

*$\Delta T$ is the thickness removed in the unexposed areas during the development time. These values indicated that the improved development rate was not achieved at the cost of loss desired resist remaining in the unexposed regions.

Example 1 clearly indicates a marked improvement in the development rate compared to that of any of the controls.

Example 2 - Use of Different Developer Composition

The procedure of Example 1 was repeated except that a similar stock resist composition, obtained under the trade name "AZ-1350J" from Shipley Company, Newton, Mass., was used instead, and the developer comprised sodium hydroxide, available under the trade name "AZ Developer" from Shipley Company. Table II indicates the development rates:

TABLE II

| Example | Sensitivity-Enhancing Agent | Development Rate (Sec.) | $\Delta T^*$ (A) |
|---|---|---|---|
| Control D | none | 55 | 100–200 |
| Control E | benzotriazole | 33 | 0 |
| Control F | 5-chlorobenzotriazole | 19 | 100–200 |
| 2 | polychlorobenzotriazole (same as Ex. 1) | 11 | 100–200 |

*$\Delta T$ has the same meaning as in Table I.

Example 3 - Indazole as the Sensitivity-Enhancing Agent

The procedure of Example 2 was repeated, except that the sensitivity-enhancing agent was that set forth in Table III, which also indicates the development rates that occurred.

TABLE III

| Example | Sensitivity-Enhancing Agent | Development Rate (sec.) |
|---|---|---|
| Control G | none | 55 |
| Control H | indazole | 41 |
| 3 | polychloroindazole, mixture, n ≅ 3.2 | 20 |

Comparative Examples 1–4

The procedure of Example 2 was repeated, except that the potential sensitivity-enhancing agents were those set forth in Table IV hereinafter.

TABLE IV

| Comparative Example | Sensitivity-Enhancing Agent | Development Rate (sec.) |
|---|---|---|
| Control I | none | 55 |
| Control J | pyridine | 62 |
| 1 | 2,5-dichloropyridine | 57 |
| 2 | pentachloropyridine | >120 |
| Control K | quinoline | 87 |
| 3 | 4,7-dichloroquinoline | >120 |
| Control L | quinoxaline | 52 |
| 4 | 2,3-dichloroquinoxaline | >120 |

The failure of Comparative Example 4 to give improved rates demonstrated the importance of the enhancing agent having a hydrogen atom bonded to at least one of the nitrogens.

The invention has been described in detail with particular reference to preferred embodiments thereof, but it will be understood that variations and modifications can be effected within the spirit and scope of the invention.

What is claimed is:

1. In a positive-working composition sensitive to light or electron beams comprising in admixture a 1,2-quinone diazide condensation product and a sensitivity-enhancing agent;
   the improvement wherein said sensitivity-enhancing agent is a heterocyclic compound having one, two or three rings, the nuclear atoms of which consist of carbon atoms and from 2 to 4 nitrogen atoms, at least one of the nitrogen atoms being bonded to hydrogen, said compound having at least two halogen substituents bonded to said nuclear carbon atoms.

2. A composition as defined in claim 1, wherein said sensitivity-enhancing agent is a polyhalogenated form of a compound selected from the group consisting of benzotriazole; 1,2-naphthotriazole; indazole; 6,7-dihydro-5H-pyrrolotetrazole; and 1,3,4-imidazopyridine.

3. A composition as defined in claim 1, wherein said sensitivity-enhancing agent has the formula

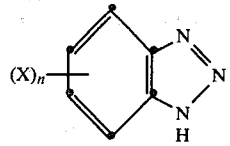

wherein X is halogen and n is a number from 2 to 4.

4. A composition as defined in claim 3, wherein said sensitivity-enhancing agent is a mixture of compounds having n = 2, 3 and 4 in admixture.

5. In a positive-working resist composition sensitive to light or electron beams comprising, in admixture, a 1,2-quinone diazide sulfonic acid condensation product and a sensitivity-enhancing agent;
   the improvement wherein said sensitivity-enhancing agent comprises

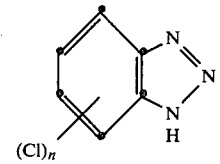

wherein n is a number from 2 to 4.

6. A support having thereon a composition as defined in claim 1, 2, 3, 4, or 5.

7. In a method of forming a resist image by imagewise exposing to light or electron beams a resist composition comprising in admixture, a 1,2-quinone diazide condensation product and a sensitivity-enhancing agent, and developing the resist image by completely removing the exposed portions,
   the improvement wherein the developability of said resist is increased by means of a sensitivity-enhancing agent which comprises a heterocyclic compound having one, two or three rings, the nuclear atoms of which consist of carbon atoms and from 2 to 4 nitrogen atoms at least one of which is bonded to hydrogen, and at least two halogen substituents appended from said nuclear carbon atoms.

* * * * *

UNITED STATES PATENT AND TRADEMARK OFFICE
CERTIFICATE OF CORRECTION

PATENT NO. : 4,365,019
DATED : December 21, 1982
INVENTOR(S) : Robert C. Daly and John R. Guild It is certified that error appears in the above-identified patent and that said Letters Patent are hereby corrected as shown below:

Col. 7, line 36, after "positive-working", insert --resist--; line 37, "in admixture", should read --, in admixture,--.

Col. 8, line 37, "in admixture,", should read --, in admixture,--.

Signed and Sealed this

Twenty-sixth Day of March 1985

[SEAL]

Attest:

DONALD J. QUIGG

Attesting Officer

Acting Commissioner of Patents and Trademarks